United States Patent
Gilbert

(10) Patent No.: US 6,204,719 B1
(45) Date of Patent: Mar. 20, 2001

(54) RMS-TO-DC CONVERTER WITH BALANCED MULTI-TANH TRIPLET SQUARING CELLS

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/245,051

(22) Filed: Feb. 4, 1999

(51) Int. Cl.$^7$ .................................................. G06F 7/556

(52) U.S. Cl. ............................................ 327/349; 327/346

(58) Field of Search ..................................... 327/102, 346, 327/347, 348, 349, 361, 355, 53, 66, 103, 104

(56) References Cited

U.S. PATENT DOCUMENTS

| | | | |
|---|---|---|---|
| 3,423,578 | * 1/1969 | Platzer, Jr. et al. | 702/198 |
| 3,657,528 | * 4/1972 | Plante | 327/348 |
| 3,723,845 | * 3/1973 | Duckworth | 324/106 |
| 4,250,457 | * 2/1981 | Hofman | 329/101 |
| 4,359,693 | * 11/1982 | Sauer | 329/101 |
| 5,489,868 | 2/1996 | Gilbert | 327/351 |
| 5,585,757 | * 12/1996 | Frey | 327/348 |
| 5,909,136 | * 6/1999 | Kimura | 327/356 |

OTHER PUBLICATIONS

Barrie Gilbert, "Novel Technique For R.M.S.–D.C. Conversion Based On The Difference Of Squares," *Electronics Letters*, Apr. 17, 1975, vol. 11, No. 8, pp. 181–182.

Barrie Gilbert, "Current–mode Circuits From a Translinear Viewpoint: A Tutorial", Chapter 2 in *Analogue IC design: the current–mode approach*, C. Toumanzou, F.J. Lidgey & D.G. Haigh, eds., 1990. (pp. 11–91).

* cited by examiner

Primary Examiner—Timothy P. Callahan
Assistant Examiner—Hai L. Nguyen
(74) Attorney, Agent, or Firm—Marger Johnson & McCollom, P.C.

(57) ABSTRACT

An RMS-to-DC converter implements the difference-of-squares function by utilizing two identical squaring cells operating in opposition to generate two signals. An error amplifier nulls the difference between the signals. When used in a measurement mode, one of the squaring cells receives the signal to be measured, and the output of the error amplifier, which provides a measure of the RMS value of the input signal, is connected to the input of the second squaring cell, thereby closing the feedback loop around the second squaring cell. When used in a control mode, a set-point signal is applied to the second squaring cell, and the output of the error amplifier is used to control a variable-gain device such as a power amplifier which provides the input to the first squaring cell, thereby closing the feedback loop around the first squaring cell. Accurate square law approximation at microwave frequencies can be achieved by implementing the squaring cells as series-connected three-transistor multi-tanh transconductance cells. By using carefully balanced squaring cells and a well-balanced error amplifier, approximation errors are cancelled and accurate RMS measurement is realized at high frequencies. A feedforward bootstrapping feature uses an op amp to balance the voltages at the common nodes of the transconductance squaring cells and also provides a balanced differential input drive to one of the squaring cells. A base current compensation circuit for providing accurate base compensation current to both of the squaring cells prevents errors due to DC offset voltages.

49 Claims, 9 Drawing Sheets

RMS-TO-DC CONVERTER WITH BALANCED MULTI-TANH TRIPLET SQUARING CELLS

BACKGROUND OF THE INVENTION

1. Field of the Invention

The present invention relates generally to RMS-to-DC converters, and more particularly, to an RMS-to-DC converter that utilizes balanced squaring cells and is capable of measuring true power at microwave frequencies.

2. Description of the Related Art

RMS-to-DC converters are used to convert the RMS (root-mean-square) value of an arbitrary signal into a quasi-DC signal that represents the true power level of the signal. Numerous techniques have been devised for performing RMS-to-DC conversions. One of the most fundamental is known as the "thermal" method. With the thermal method, the signal is used to generate heat in a resistive dissipator. The heat is then measured, usually by establishing a temperature balance using a second dissipator. The DC input to the second dissipator then provides a measure of the RMS value of the signal. Another technique involves "computing" converters which utilize nonlinear analog signal processing. Examples of computing converters include an "explicit" converter, which utilizes an amplitude squaring cell followed by a filter and then a square rooter, and an "implicit" converter which utilizes an absolute value cell followed by a squarer-divider and a filter embedded in the a feedback loop.

Another type of computing converter which operates on the "difference of squares" principle. This circuit utilizes a differential input, four-quadrant multiplier and shares some of the features of both the thermal technique, and the previously described computing techniques. Like the advanced thermal techniques, it seeks to null the difference between the square of the input and the DC output. However, like the other computing converters, it utilizes nonlinear signal processing elements. All of these techniques are discussed more thoroughly in an article by Barrie Gilbert: "Novel Technique For R.M.S.-D.C. Conversion Based On The Difference Of Squares," *Electronics Letters*, Apr. 17, 1975, Vol. 11, No. 8, pp. 181–182.

Although the techniques discussed above can provide an accurate measure of the true RMS value of a signal at relatively low frequencies, they do not operate well at microwave frequencies, i.e., upwards of 1 GHz. Signal measuring devices capable of operation at microwave frequencies are available, e.g., diode detectors, but they are not true RMS detectors. Instead, they are essentially "envelope" detectors which respond to the amplitude of the modulation envelope of a signal (and power indirectly), rather than responding inherently to the power of a complex waveform such as a CDMA carrier and its noise-like modulation.

Accordingly, a need remains for an improved technique for measuring the true RMS value of a signal.

SUMMARY OF THE INVENTION

An RMS-to-DC converter constructed in accordance with the present invention implements the "difference-of-squares" function by utilizing two identical squaring cells operating in opposition to generate two currents. An error amplifier nulls the difference between the currents by feedback proportional to the RMS value of the signal to one of the two squaring cells.

When used in a measurement mode, one of the squaring cells receives the signal to be measured, and the output of the error amplifier, which provides a measure of the true RMS value of the input signal, is connected to the input of the second squaring cell, thereby closing the feedback loop around the second squaring cell and establishing the scaling factor.

When used in a control mode, a set-point signal is applied to the second squaring cell, and the output of the error amplifier is used to control a variable-gain device such as a power amplifier which provides the input to the first squaring cell, thereby closing the feedback loop around the first squaring cell. Since the feedback loop is always closed around one of the two squaring cells, an implicit square-root function is implemented.

An RMS-to-DC converter constructed in accordance with the present invention can also be operated as a power comparator, in which case there is no feedback connection. In this mode, the signal to be measured is applied to the first squaring cell, a threshold signal is applied to the second squaring cell, and the output from the nulling circuit swings towards one of the power supply voltages depending on whether the RMS value of the measured signal is greater or less than the threshold signal.

By implementing the squaring cells as series-connected three-transistor multi-tanh transconductance cells using a suitable integrated circuit technology, accurate square law approximation from DC up to microwave frequencies can be achieved.

By using carefully balanced squaring cells and a well-balanced error amplifier, some of the inherent approximation errors are essentially cancelled.

One embodiment uses feedback bootstrapping to equalize the common mode voltage at the inputs to the squaring cells. By equalizing the common mode voltages at the common emitter nodes of the transconductance squaring cells, the balance of the overall structure is improved.

Another embodiment implements feedforward bootstrapping using an op amp to balance the voltages at the common nodes of the transconductance squaring cells. This also serves to provide a balanced differential input drive to one of the squaring cells.

A base current compensation circuit is used in both of the squaring cells, thereby minimizing errors caused by certain DC offset voltages generated by base currents.

DETAILED DESCRIPTION

Basic Topology

Figure 1:
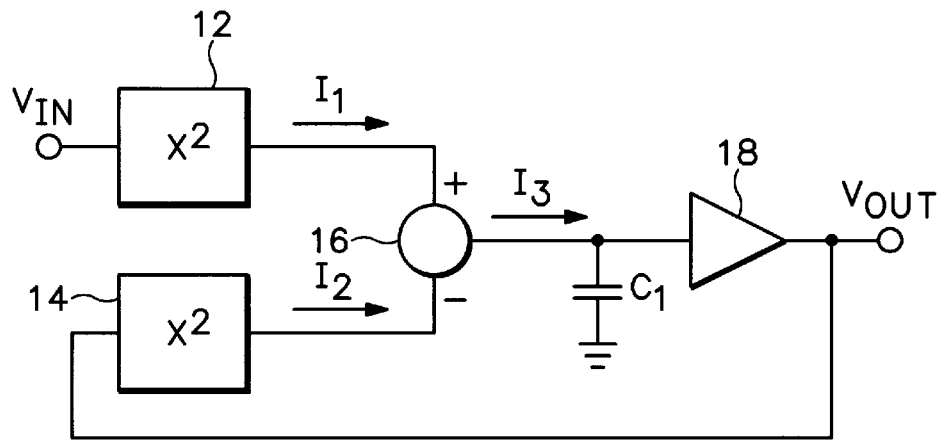
FIG. 1 is a diagram of an embodiment of an RMS-to-DC converter in accordance with the present invention configured for operation in a measurement mode.

FIG. 1 is a simplified diagram of an embodiment of an RMS-to-DC converter circuit in accordance with the present invention configured for measuring the RMS value of an input signal. The circuit includes two squaring cells 12 and 14, and a nulling circuit including a differencing circuit 16, a capacitor C1, and a buffer amplifier 18. The first squaring cell 12, which will also be referred to as the high frequency or "HF" squaring cell, generates a current $I_1$ which is closely proportional to the square of the input voltage $V_{IN}$. The second squaring cell 14, which will also be referred to as the DC squaring cell, generates a current $I_2$ which is proportional to the square of the output signal $V_{OUT}$. The outputs of the squaring cells are connected to the inputs of a differencing circuit 16 which subtracts the currents $I_1$ and $I_2$ and generates a difference current $I_3$ which is equal to $I_1-I_2$. The difference current $I_3$ is integrated by capacitor C1 which is connected between the output terminal of the differencing circuit 16 and power supply common GND. The buffer amplifier 18, which is a low gain amplifier in this embodiment, buffers the voltage across C1 to generate the final output voltage $V_{OUT}$ which is the integral of the current difference $I_1-I_2$. C1 sets the corner frequency of the circuit in conjunction with the transconductance (gin) of the squaring cells. $V_{OUT}$ is fed back to the input of the DC squaring cell 14, and the buffer amplifier servos the system so as to null the error, thereby forcing the average value of the difference current $I_3$ to exactly zero when the integration process is accurate.

The voltage at the input to the DC squaring cell, i.e., $V_{OUT}$, is forced to be equal to the RMS voltage of the input signal $V_{IN}$ to the HF squaring cell. Thus, in the circuit of FIG. 1, the HF squaring cell provides the squaring function, the capacitor provides the averaging function, and the connection of the DC squaring cell in the feedback network implements an implicit square rooting function, i.e., the "root" part of the RMS (root-mean-square) function.

Figure 5:
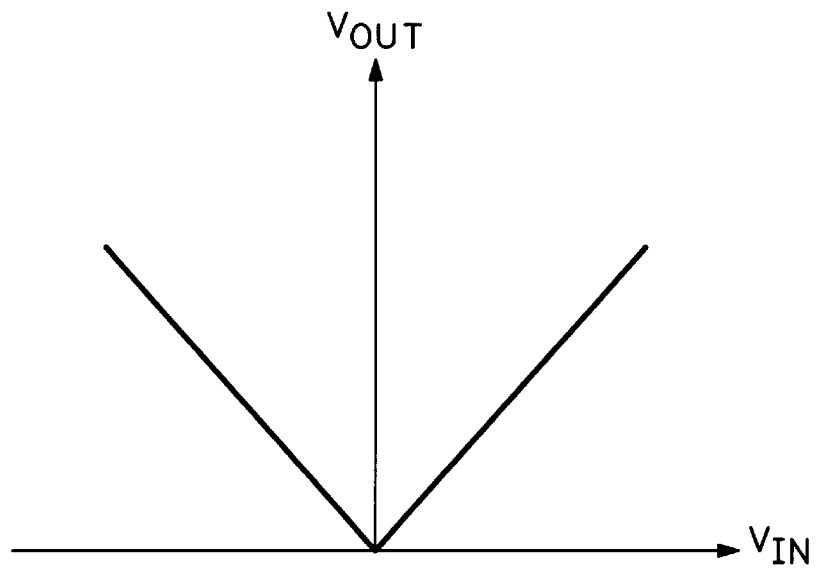
FIG. 5 is a graph illustrating an aspect of the operation of the circuit of FIG. 1.

When a DC signal, or a low frequency AC signal having a frequency significantly below the corner frequency of the overall feedback system, is applied to the input terminal, the signal $V_{OUT}$ becomes simply the absolute value of the input signal $V_{IN}$ as shown in FIG. 5.

When an AC input signal having a frequency substantially above the corner frequency is applied to the input terminal, the circuit generates a quasi-DC, i.e., stationary, signal $V_{OUT}$ which is linearly proportional to the RMS value of $V_{IN}$.

An advantage of the circuit of FIG. 1 is that the outputs from the squaring cells are currents. Therefore, the differencing circuit can be implemented as a simple wire connection operating as a summing node. This minimal structure is very effective at high frequencies.

Figure 2:
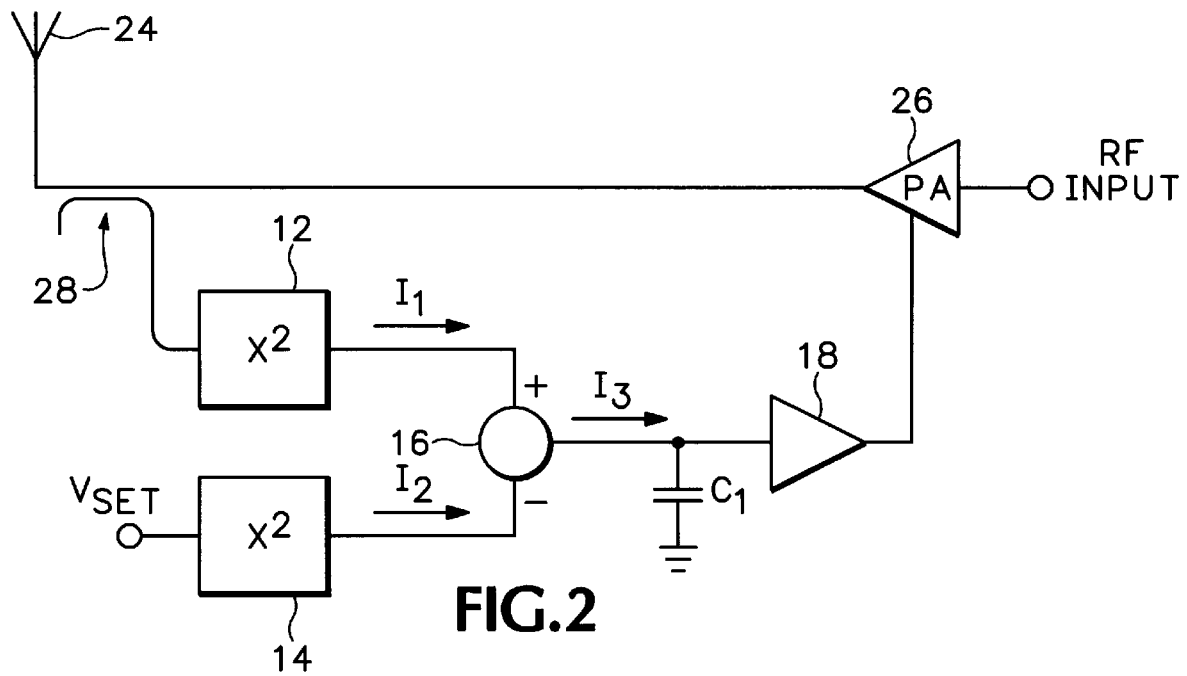
FIG. 2 is a diagram of an embodiment of an RMS-to-DC converter in accordance with the present invention configured for operation as a controller.

FIG. 2 is a simplified diagram of an embodiment of an RMS-to-DC converter constructed in accordance with the present invention configured for controlling the power directed to an antenna 24 or other load which is driven by a variable-gain power amplifier 26.

The circuit of FIG. 2 is similar to that of FIG. 1, but the feedback loop is now closed around the HF squiring cell 12 rather than the DC squaring cell 14. In a transmitter application, the input signal to the HF squaring cell 12 is typically provided by a directional coupler 28 which diverts a small portion of the RF power traveling towards the antenna. The square of the input voltage to the HF squaring cell is a measure of the output power of the antenna. The output signal from the buffer amplifier 18 is used to control the gain of the power amplifier 26, thereby closing the feedback loop around the HF squaring cell. A "set-point" signal $V_{SET}$ is applied to the input of the DC squaring cell 14, which determines the power needed at the sending point to balance the loop, which occurs when the average current into the capacitor C1 is zero.

As with the circuit of FIG. 1, the buffer amplifier in the circuit of FIG. 2 servos the loop so as to null the error by forcing the average value of the difference current $I_3$ to zero. Therefore, the RMS power output from the antenna is regulated to be proportional to the value of the set-point voltage $V_{SET}$.

Figure 3:
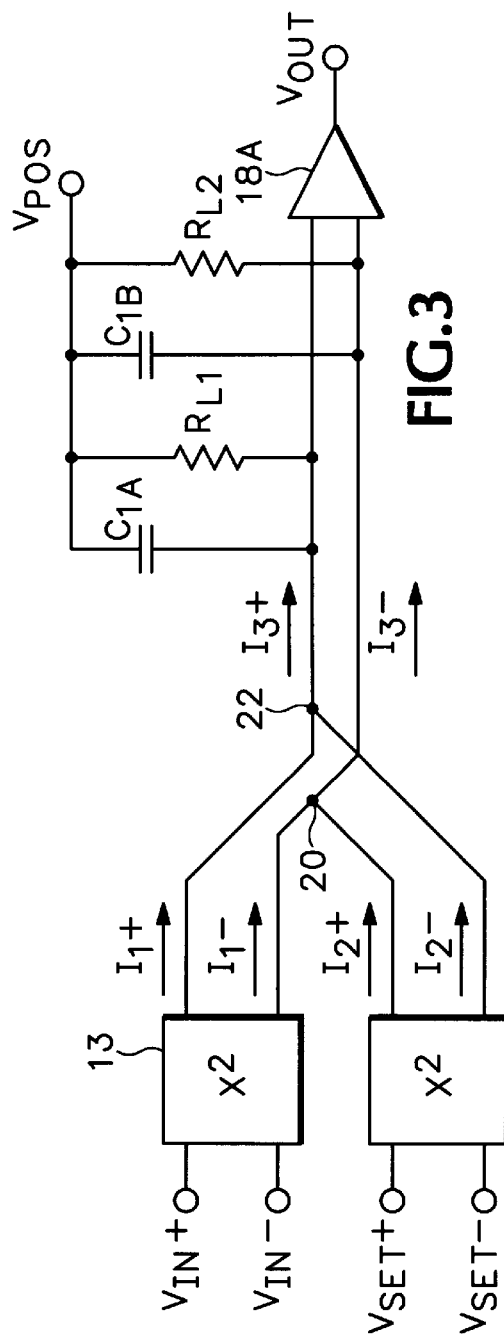
FIG. 3 is a simplified diagram of a fully-differential embodiment of an RMS-to-DC converter constructed in accordance with the present invention.

FIG. 3 is a simplified diagram of a fully-differential embodiment of an RMS-to-DC converter constructed in accordance with the present invention. The circuit of FIG. 3 is similar to those shown in FIGS. 1 and 2, but the squaring cells 13 and 15 have fully differential voltage inputs and differential current outputs. The output currents $I_1+$, $I_1-$ and $I_2+$, $I_2-$ from the squaring cells are shown wired together at nodes 20 and 22 resulting in a third differential current pair $I_3+$, $I_3-$. Capacitor $C_{1A}$ and resistor $R_{L1}$, which are connected in parallel between node 22 and a power supply $V_{POS}$, form a first low-pass filter. Capacitor $C_{1B}$ and resistor $R_{L2}$, which are connected in parallel between node 21 and a power supply VPOS, form a second low-pass filter. In this embodiment, amplifier 18A is high-gain operational amplifier with differential inputs.

The circuit of FIG. 3 can be configured in a measurement mode as in FIG. 1, a control mode as in FIG. 2, or a power comparator mode, in which case the signal to be measured is applied to the first squaring cell, a threshold signal is applied to the second squaring cell, and the output from the nulling circuit swings high or low depending on whether the RMS value of the measured signal is greater or less than the threshold signal.

Figure 4:
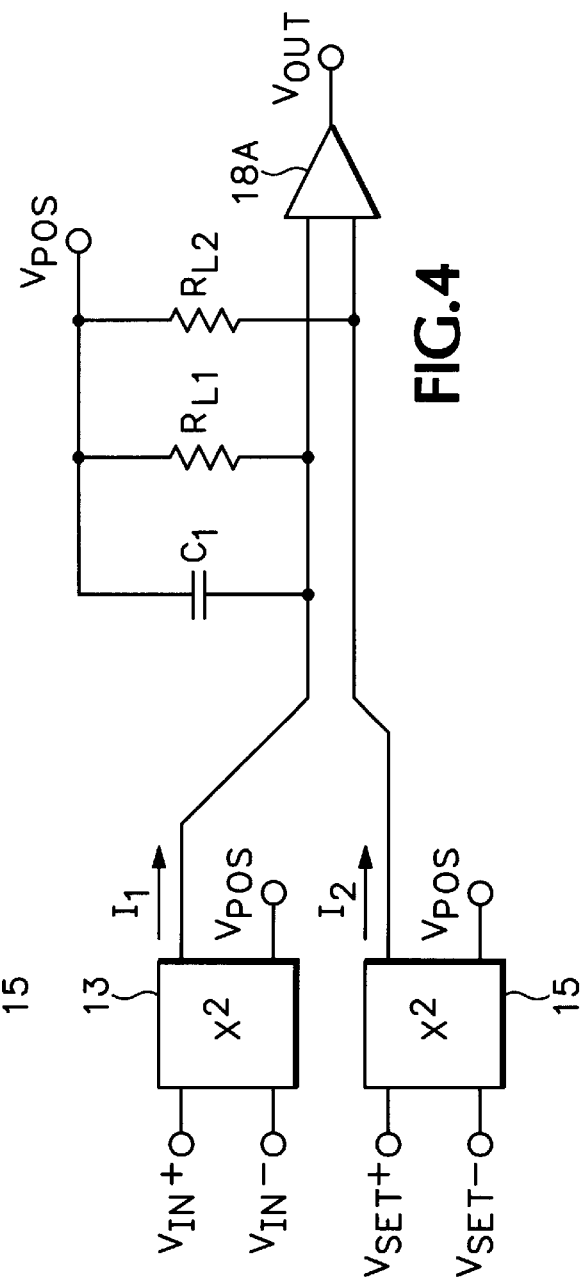
FIG. 4 is a simplified diagram of another differential embodiment of an RMS-to-DC converter constructed in accordance with the present invention.

FIG. 4 is a simplified diagram of another differential embodiment of an RMS-to-DC converter constructed in accordance with the present invention. The circuit of FIG. 4 is similar to that of FIG. 3, but one of the differential outputs from each of the squaring cells is connected to the power supply VPOS or any other point that will simply discard the current from that output terminal. Since the DC squaring cell 15 operates at quasi-DC frequencies, only one capacitor C1 is needed to provide the low-pass filter function.

Detailed Implementation

Figure 6:
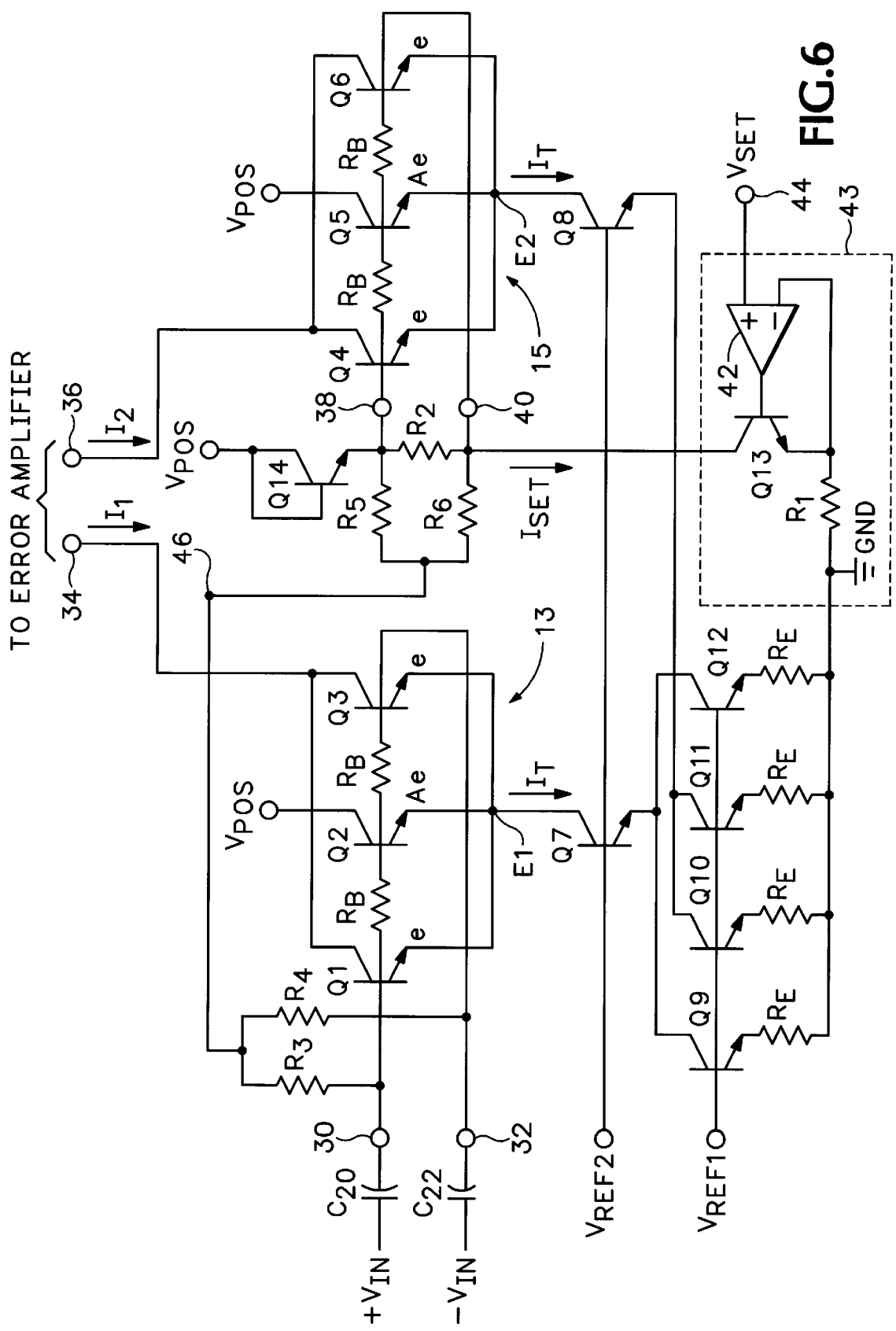
FIG. 6 is schematic diagram showing details of a practical embodiment of an RMS-to-DC converter in accordance with the present invention.

FIG. 6 is schematic diagram showing a practical embodiment of an RMS-to-DC converter circuit in accordance with the present invention intended for fabrication as a monolithic integrated circuit. The circuit of FIG. 6 includes fully differential squaring cells as shown in FIG. 4, and it can be configured for operation as either a measurement or control circuit as shown in FIGS. 1 and 2, or as a power comparator.

The HF squaring cell 13 of FIG. 6 is implemented as a series-connected multi-tanh transconductance cell ("gm" cell) comprising NPN transistors Q1, Q2 and Q3. The bases of the "outer" transistors Q1 and Q3 are connected to input terminals 30 and 32, respectively, to receive the differential input voltage $V_{IN}$. A first resistor $R_B$ is connected between the bases of Q1 and the "inner" transistor Q2, and a second resistor $R_B$ is connected between the bases of Q2 and Q3. These resistors result in the voltage drive to Q1 and Q3 being balanced in amplitude. The collector of Q2 is connected to the positive power supply rail $V_{POS}$, while the collectors of Q1 and Q3 are connected together to provide current $I_1$ to an error amplifier through terminal 34. The emitters of Q1–Q3 are commonly connected at node E1. Transistors Q1 and Q3 have an emitter area "e", and transistor Q2 has an emitter area of "Ae", that is, a multiple (A) of e.

A filter capacitor C1 (not shown in FIG. 6) is connected between terminal 34 and $V_{POS}$. In a preferred embodiment, C1 is implemented as a small on-chip capacitor, but provisions are made for connecting a larger external capacitor to terminal 34 to allow lower the corner frequency of the filter to be lowered.

Figure 14:
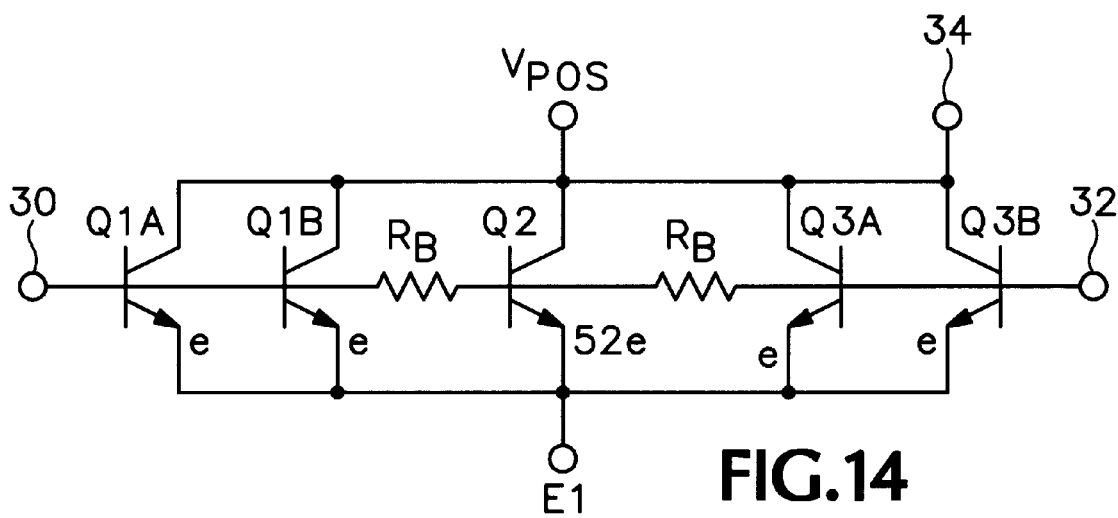
FIG. 14 is a schematic diagram of a preferred embodiment of one of the squaring cells of FIG. 6.
Figure 15:
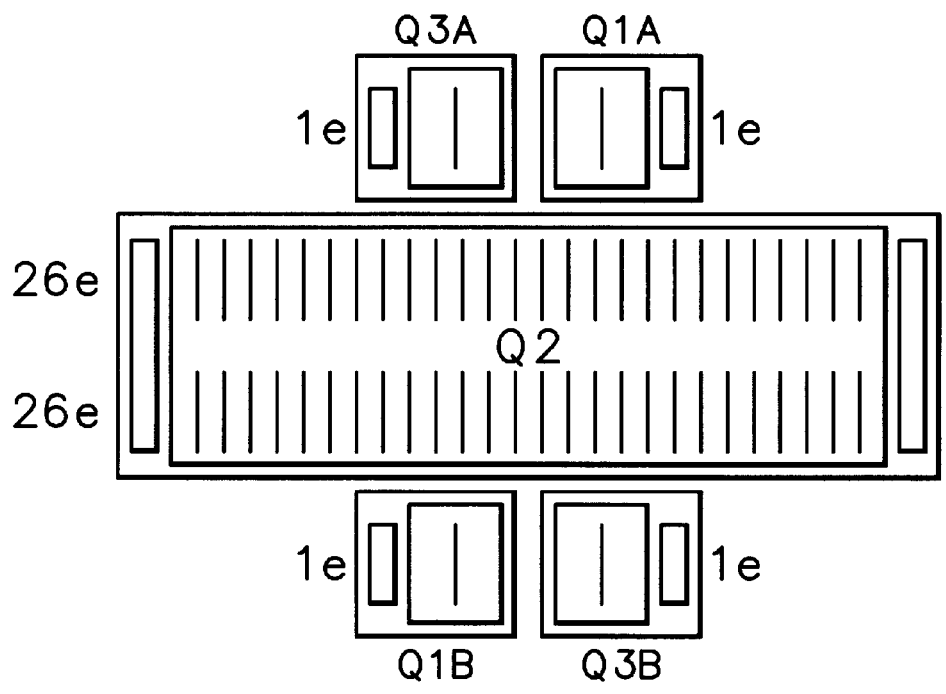
FIG. 15 is a diagram showing the layout of the squaring cell of FIG. 14.

The DC squaring cell 15 is a replica of the HF squaring cell 13 using transistors Q4–Q6 in place of Q1–Q3. The emitters of Q4–Q6 are commonly connected at node E2, and the current $I_2$ is generated at the collectors of Q4 and Q6. Transistors Q4 and Q6 receive a differential input voltage at terminals 38 and 40, respectively. The transistors in both the HF and DC squaring cells should be laid out on the chip in a cross-quad connection so as to provide good balance between the devices. Each of the outer transistors is preferably implemented as two parallel transistors as shown in FIG. 14 to facilitate a cross-quad layout as shown in FIG. 15.

The input voltage $V_{IN}$ to the HF squaring cell 13 is capacitively coupled to the input terminals 30 and 32 by capacitors C20 and C22 as shown in FIG. 6. A resistor input network including R3–R6 is coupled between the inputs of the HF and DC squaring cells. Resistors R3 and R4 are connected in series between the input terminals terminal 30 and 32 of the HF squaring cell. Resistors R5 and R6 are connected in series between the input terminals 38 and 40 of the DC squaring cell. The common connection point between R3 and R4 forms a node 46 which is also connected to the common connection point between R5 and R6.

A bias circuit including NPN transistors Q7–Q12 and four resistors $R_E$ is used to bias the squaring cells 13 and 15 in conjunction with bias voltages $V_{REF1}$ and $V_{REF2}$. Transistors Q9–Q12 are connected in a cross-quad wherein the collectors of Q10 and Q11 are connected together, and the collectors of Q9 and Q12 are connected together. The emitters of each of Q9–Q12 are connected to the power supply ground terminal GND through one of the emitter degeneration resistors $R_E$. The bases of Q9–Q12 are commonly connected to a reference voltage source $V_{REF1}$ as is known in the art. On an integrated circuit, transistors Q9–Q12 can be laid out in either a full cross quad, i.e., in a two-by-two grid with Q10 and Q11 in opposite corners, or in a linear cross quad (also referred to as "A-B-B-A"), i.e., arranged in a linear row with Q10 and Q11 on the inside and Q9 and Q12 on the outside. In either case, the objective is to provide highly balanced bias currents to the two squaring cells.

Transistors Q7 and Q8 are connected in a cascode arrangement wherein the emitters of Q7 and Q8 are connected to the collectors of Q10 and Q9, respectively, and the bases of Q7 and Q8 are commonly connected to a second reference voltage source $V_{REF2}$. The collector of Q7 is connected to node E1, and the collector of Q8 is connected to node E2.

A set-point interface circuit 43 includes NPN transistor Q13, resistor R1, and operational amplifier 42. The collector of Q13 is connected to one of the input terminals 40 of the DC squaring cell, its emitter is connected to GND through resistor R1, and its base is connected to the output of the op amp 42. The inverting input of the op amp is connected to the emitter of Q13, and the noninverting input receives the set-point voltage $V_{SET}$ at terminal 44 to generate the current $I_{SET}$ at the collector of Q13.

The set-point interface 43 is interfaced to the DC squaring cell with a resistor R2, which is connected between the differential input terminals 38 and 40 of the DC squaring cell, and a diode-connected transistor Q14 which is connected between terminal 38 and $V_{POS}$ to provide bias "headroom" for the input of the DC squaring cell. The input voltage to the DC squaring cell is determined by the current $I_{SET}$ which generates a voltage across R2 in parallel with R5 and R6 (which are connected in series) and the base resistors $R_B$ (which are also connected in series).

An error amplifier (not shown) is used to generate an output signal $V_{OUT}$ responsive to the difference of the currents $I_1$ and $I_2$. A preferred embodiment of an error amplifier is described below with reference to FIG. 13. When configured for measurement, the output signal $V_{OUT}$ from the error amplifier is used as $V_{SET}$ to generate the signal $I_{SET}$ as a feedback signal to the DC squaring cell. In a control mode, $V_{SET}$ is a set-point signal, and $V_{OUT}$ is used to control the gain of a device such as an RF power amplifier. The output from the power amplifier is then sampled and used as the input to the HF squaring cell.

Squaring Cell Operation

Figure 7:
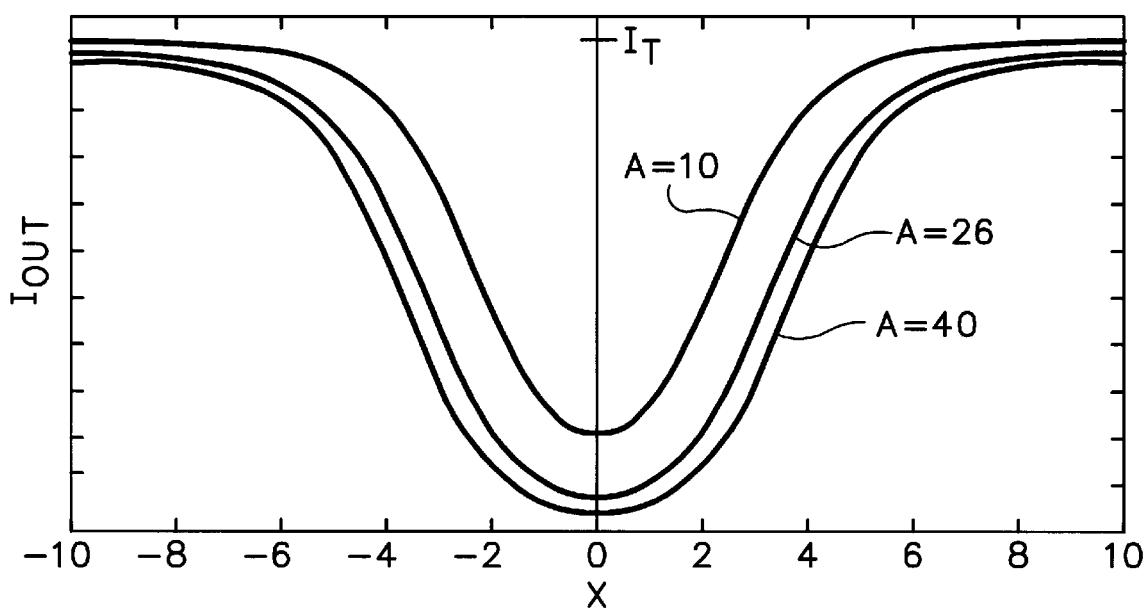
FIG. 7 is a graph illustrating an aspect of the operation of one of the squaring cells of the circuit of FIG. 6 for various values of emitter area ratio.

FIG. 7 is a graph showing the output current $I_{OUT}$ from either of the squaring cells 13 or 15 as a function of input voltage $V_{IN}$ across the cell for three different values of the emitter area ratio A. It is apparent from FIG. 7 that the choice of the emitter area ratio A used in the squaring cells is important because it determines the shape of the output function. Maximum accuracy is obtained when the curve most nearly approximates a parabolic (square law) form.

The output current from the squaring cell is given by the following expression:

$$I_{OUT} = I_{C1} + I_{C3} = \frac{\exp(x) + \exp(-x)}{\exp(x) + A + \exp(-x)} I_T \quad \text{(Eq. 1)}$$

where $x = V_{IN}/2V_T$ and $V_T$ is the thermal voltage, kT/q.

Each of the curves shown in FIG. 7 has a minimum value when the input signal is zero. This is called the zero-signal baseline current $I_{ZS}$ and it is equal to $2/(2+A)I_T$. Therefore, the output current $I_{OUT}$ can be expressed as:

$$I_{OUT} = I_{SQR} + I_{ZS} \quad \text{(Eq. 2)}$$

where $I_{SQR}$ is the desired portion of the output function that closely approximates a square law. (It should be noted that an advantage of the use of dual squaring cells having identical response is that the zero-signal baseline current $I_{ZS}$, i.e., the displacement of the output curve along the vertical axis, is exactly cancelled.)

To make comparisons with a square-law function, the zero-signal baseline current $I_{ZS}$ must be removed from Eq. 1 as follows:

$$I_{SQR} = \left\{ \frac{\exp(x) + \exp(-x)}{\exp(x) + A + \exp(-x)} - \frac{2}{2+A} \right\} I_T \quad \text{(Eq. 3)}$$

For small values of x, Eq. 3 can be approximated by $$I_{SQR} = \frac{x^2}{4(1 + 1/A) + A} I_T \quad \text{(Eq. 4)}$$

which is a true square law function. This approximation is useful up to about x+±3 ($V_{IN}=\pm 150$ mV at T=300 K).

Figure 8:
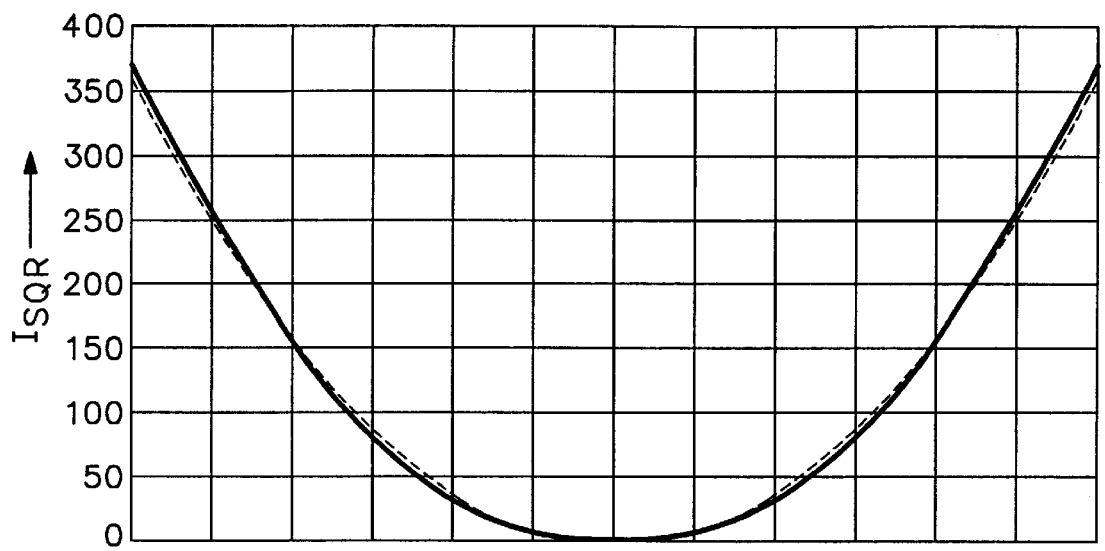
FIG. 8 is a graph showing the actual output curve of a squaring cell in accordance with the present invention compared to an ideal square law function.
Figure 9:
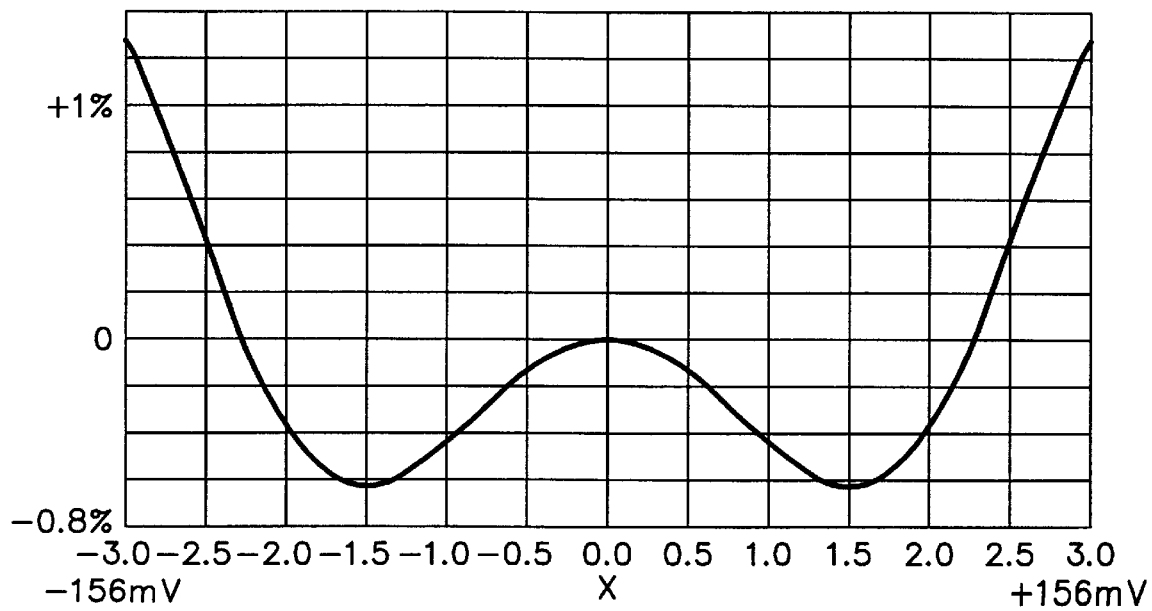
FIG. 9 is a graph showing the approximation error for the actual output curve shown in FIG. 8.

FIG. 8 is a graph showing the actual $I_{SQR}$ (solid line) and the true square law curve of Eq. 4 (broken line) for input values of x from −3 to +3 using an emitter area ratio A of 26. FIG. 9 is a graph showing the approximation error, i.e., the difference between the curves of FIG. 8. The law conformance is roughly ±1% for all $V_{IN}$ up to ±150 mV.

In general, it is desirable to maximize the input voltage range of the squaring cell, as this makes the circuit more useful to the end user, while simultaneously maximizing the change in output current as the input voltage swings through its full range. The approximation error should be minimized to obtain the most accurate RMS-to-DC conversion, although it should be noted that the opposing outputs of the HF and DC squaring cells contributes significantly to a reduction in the overall error of the closed loop system. The curves shown in FIGS. 7–8 are useful for determining the optimum value of A that maximizes the output change while minimizing the approximation error.

As is apparent from FIG. 7, there is a point at either side of the output function, corresponding to large values of $V_{IN}$, beyond which, the output current $I_{OUT}$ departs seriously from the ideal square law. As A is increase, the voltage range is extended outward, thereby increasing the usable input voltage range. That is, as A is increased, the fit of the actual curve to the ideal square law improves at high input voltage levels. Also, the zero-signal baseline current decreases as A increases, and therefore, the total output current swing increases.

However, increasing A also flattens the curvature of the function at low signal levels (i.e., near zero on the vertical axis), thereby reducing the sensitively to low signal levels. That is, when the curve is flatter, a larger change in input voltage is required to change the output current by a certain amount. Thus, lower values of A increase the gradient of the curvature around the center portion of the curve, thereby providing better sensitivity and square law behavior for small $V_{IN}$. It has been determined that a value of A=26 provides a very good approximation to a square law form over an acceptable range of input voltage. Compared to other techniques for measuring RMS power, the simple three-transistor transconductance cell used to implement the squaring cells 13 and 15 in FIG. 6 provides a more effective solution for applications operating from very low to microwave frequencies.

An advantage of the circuit of FIG. 6 is that only the HF squaring cell 13 must operate at the signal frequencies applied to the circuit. Capacitor C1 immediately low-pass filters the squared signal $I_1$, which has twice the input frequency for a sinewave excitation, so the remainder of the circuit including the error amplifier, the DC squaring cell, and the set-point interface can operate at lower frequencies. This is in contrast to a circuit that implements the "difference of squares" function with a four-quadrant multiplier in which the entire multiplier must operate at the frequency of the input signal $V_{IN}$, with the output at twice the signal frequency.

When implemented with an appropriate integrated circuit fabrication process, e.g., a process having an $f_T$ of about 25 GHz, the circuit of FIG. 6 is suitable for operation at frequencies up to at least 10 GHz, although packaging parasitics typically limit the accurate range to about 5 GHz. Excellent overall linearity is achieved over a dynamic range of about 30 dB.

It should also be noted that the squaring cell's instantaneous deviation from an ideal quadratic response is of less interest than the integral error when the circuit of FIG. 6 operates as a complete RMS converter. Since a practical input signal will cause the output current to travel back and forth along the curve, the positive and negative deviations from the ideal curve, such as depicted in FIG. 7, will tend to cancel each other.

It should further be noted that, when the frequency of the input signal is much less than the corner frequency of the filter, the circuit provides a precise absolute value (AV) function regardless of the exact function implemented by the squaring cells, because the two balanced squaring cells exhibit identical errors which cancel in the closed loop response of the overall nonlinear system.

The squaring cells can alternatively be implemented so that the collectors of the outer transistors Q1,Q3 and Q4,Q6 are connected to $V_{POS}$, and the currents $I_1$ and $I_2$ are obtained at the collectors of the inner transistors Q2 and Q4. This results in a function that is inverted as compared to the function of FIG. 7. Thus, the largest output current occurs for zero input signal. The optimal topology depends on the particular application. For example, when the HF squaring cell is driven with a balanced differential signal, then taking the output from Q2 has an advantage because there is no voltage change at the bases of Q2 and therefore no displacement current in its $C_{JC}$.

However, if the HF squaring cell is driven in a single-sided manner, e.g., the full input signal is applied to the base of Q1 and the base of Q3 is AC grounded, then taking the output signal from the outer transistors Q1 and Q3 has an advantage. This is because the displacement current is roughly proportional to the emitter area (more exactly, the collector-base junction area), and since the outer transistors are smaller, it can be shown that the displacement current to the output node is reduced by a factor A/2 as compared to taking the output signal from the inner transistor, which carries a large "baseline" current.

A further advantage of taking the output signal from the outer transistors is that the fractional change in the full output current for small signals is much higher compared to taking the output signal from the inner transistor.

Regardless of the whether the output signal from the squaring cells is taken from the inner transistor or the outer transistors, the highest measurement accuracy is obtained when a balanced drive is used such as that obtained by using a balun (balanced-to-unbalanced converter) or some other HF transformer external to the integrated circuit. This is partly because an unbalanced drive results in a common mode voltage at the emitter node E1 causing possibly troublesome currents in the $C_{JC}$ and $C_{JS}$ of the biasing transistor Q7 providing $I_T$ to the squaring cell.

Balance Between Squaring Cells

Because a squaring cell doubles the dynamic range of its output signal with respect to its input signal, it imperative to provide the highest level of balance possible between the two squaring cells so that the currents $I_1$ and $I_2$ are equal when the input signal $V_{IN}$ is zero.

This balance is achieved in the circuit of FIG. 6 by using well-matched, high impedance current sources to provide balanced tail currents (bias currents) $I_T$ to the squaring cells. The cross-quad arrangement of current source transistors Q9–Q12 improves the balance between the standing tail currents as does the use of emitter degeneration resistors $R_E$ which are preferably implemented as electrically and physically large devices. The cascode arrangement of transistors Q7 and Q8 further increases the impedance of the tail current sources.

Capacitive coupling of the input to the HF squaring cell allows the use of the resistor network including R3–R6 to improve the balance between the squaring cells by maintaining essentially the same common mode voltage at the inputs to both the HF and DC squaring cells. The differential input voltage to the DC squaring cell is determined by the current $I_{SET}$ flowing through R2, and the arrangement of the set-point interface establishes the common mode voltage at the input to the DC squaring cell. The resistor network R3–R6 conveys this common mode voltage back to the input of the HF squaring cell in a "feedback bootstrap" manner, thereby establishing nearly identical voltages at nodes E1 and E2 so as to minimize any residual imbalance output impedance effect due to the finite Early voltage of Q7 and Q8.

Preferred Embodiment

FIGS. 10–13 together form a schematic diagram of a preferred embodiment of an RMS-to-DC converter in accordance with the present invention. This embodiment is intended for implementation as a monolithic integrated circuit.

Figure 10:
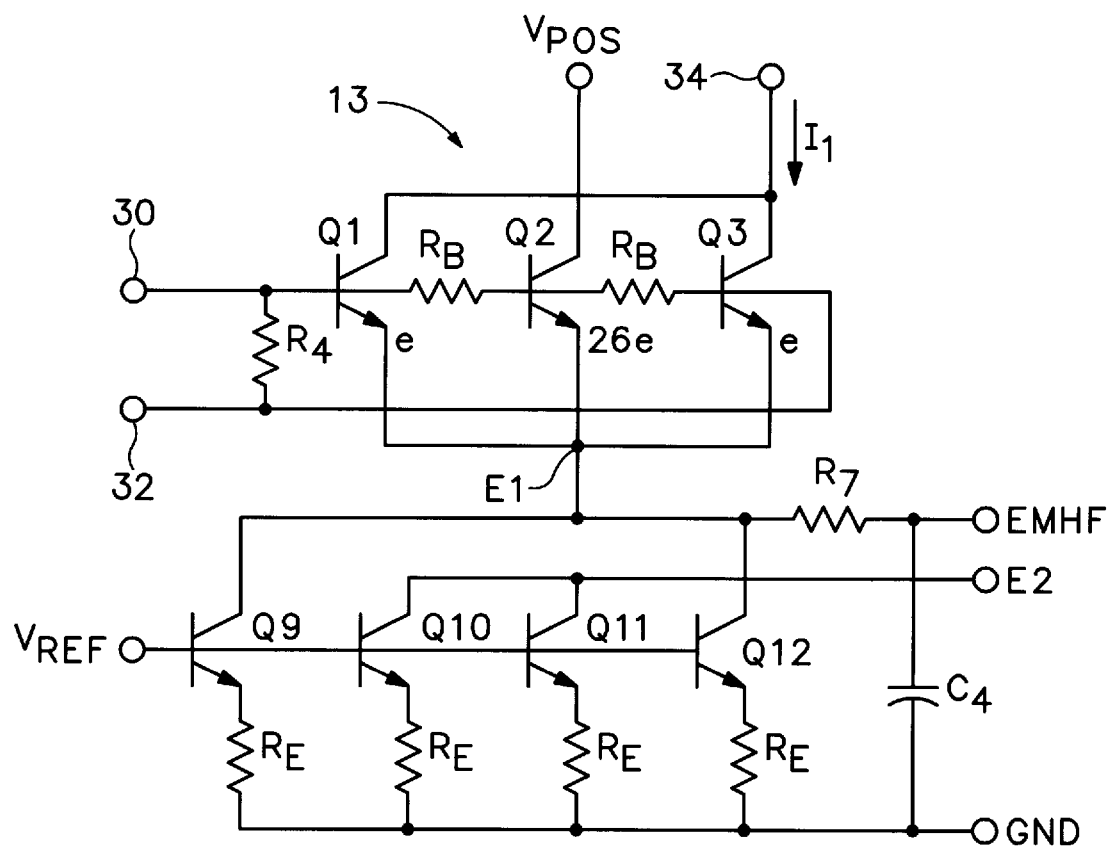
FIG. 10 is a schematic diagram showing a high frequency squaring cell and bias current source for a preferred embodiment of an RMS-to-DC converter in accordance with the present invention.

Referring to FIG. 10, the HF squaring cell 13 and current source transistors Q9–Q12 are arranged in essentially the same configuration as in FIG. 6, but the cascode transistor Q7 is eliminated, and instead, the common emitter node E1 is connected directly to the collectors of Q9 and Q12. The collectors of Q10 and Q11 are connected together at node E2. An RC filter includes a capacitor C4 connected between a node EMHF and GND and a resistor R7 connected between the nodes E1 and EMHF.

Figure 11:
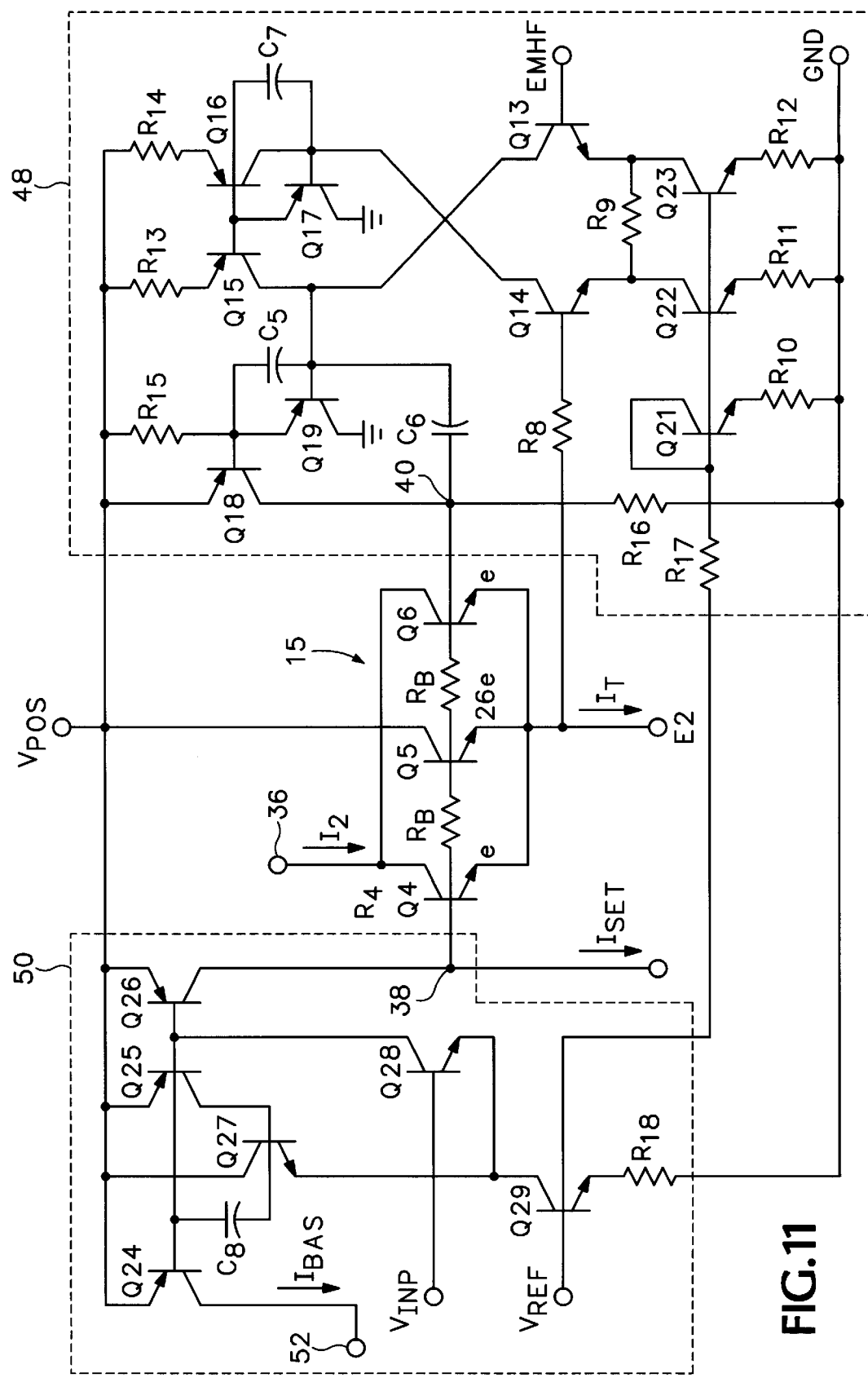
FIG. 11 is a schematic diagram showing a DC squaring cell and balancing circuit for a preferred embodiment of an RMS-to-DC converter in accordance with the present invention.

Referring to FIG. 11, the DC squaring cell 15 has the same structure as in FIG. 6, but cascode transistor Q8 is eliminated, and the common emitter node E2 is connected directly to the collectors of Q10 and Q11 in FIG. 10. A balancing circuit, which is essentially an operational amplifier, is shown generally at 48. The op amp has a first input terminal connected to node EMHF and a second input terminal connected to node E2 through resistor R8. The output terminal of op amp 48 is connected to the base of transistor Q6 at node 40.

Structure of Balancing Op Amp

Operational amplifier 48 has a differential transconductance input stage including NPN transistors Q13 and Q14 and resistor R9, and a dual current source including NPN transistors Q21–Q23 and resistors R10–R12. Transistor Q21 is diode connected with its base further connected to the bias voltage source $V_{REF}$ through resistor R17. Transistors Q22 and Q23 form current mirrors with Q21. The emitters of Q21–Q23 are connected to GND through emitter degeneration resistors R10–R12, respectively. The bases of Q13 and Q14 form the first and second input terminals of the op amp 48, respectively, and the emitters of Q13 and Q14 are connected to the collectors of Q22 and Q23, respectively, which have a resistor R9 connected therebetween.

Operational amplifier 48 also has a current mirror load including PNP transistors Q15–Q17, resistors R13–R14, and capacitor C7, and an output stage including PNP transistors Q18–Q19, resistors R15–R16, and capacitors C5–C6. Transistors Q15 and Q16 have their emitters connected to $V_{POS}$ through degeneration resistors R13 and R14, respectively, and their collectors connected to the collectors of Q13 and Q14, respectively. The bases of Q15 and Q16 are connected together and to the collector of Q16 through capacitor C7. Transistor Q17 is connected for beta compensation with its emitter connected to the base of Q17, its base connected to the collector of Q17 and its collector connected to GND.

The collector of Q18 forms the output terminal of op amp 48 and is also connected to GND through resistor R16. Transistor Q18 has its emitter connected directly to $V_{POS}$ and its base connected to $V_{POS}$ through resistors R15. Transistor Q19 has its emitter connected to the base of Q18, its base connected to the collector of Q15, and its collector grounded. Capacitor C5 is connected across the base-emitter junction of Q19, and C6 is connected between the output terminal of the op amp and the collector of Q15.

Operation of Balancing Op Amp

One function of the balancing op amp 48 is to perform a function that can be referred to as feedforward bootstrapping. Unlike the arrangement in the circuit of FIG. 6 where the input voltage to the DC squaring cell is sensed and fed back to the input of the HF squaring cell, the arrangement in the circuit of FIGS. 10 and 11 senses the average value of the voltage at the emitter terminal E1 of the HF squaring cell and feeds this voltage forward to the DC squaring cell by driving the base of Q6 so as to force the voltage at node E2 to equal that at E1. Thus, the current sources providing the currents $I_T$ to the squaring cells operate at very nearly equal collector voltages, thereby providing a high level of bias balance between the HF and DC squaring cells.

A further purpose of the balancing op amp 48 is that it inherently causes the input to the DC squaring cell to be a balanced and differential drive. The current $I_{SET}$ flows into the base resistors $R_B$ and is absorbed by Q18. As the current $I_{SET}$ increases, the base voltage of Q6 increases with respect to the base voltage of Q4. However, since the base resistors $R_B$ have equal values, and the op amp 48 forces the emitter node E2 to remain at a constant potential, then the base voltage of Q4 must fall and the base voltage of Q6 must rise by equal amounts to absorb the increase in $I_{SET}$. Thus, the balancing op amp 48 essentially pivots the base voltages of Q4 and Q6 on the common emitter voltage at node E2. So the second function of balancing op amp scheme is to implement a technique for providing a balanced and differential voltage drive to the input of the DC squaring cell from the single-sided current $I_{SET}$.

The balancing op amp 48 provides these two functions, i.e., balancing the voltages at nodes E1 and E2, and providing a balanced differential drive to the input of the DC squaring cell 15, simultaneously in a synergic manner. The two functions are interwoven. An advantage of the feedforward bootstrapping scheme described above is that it causes all of the feedback (or set-point) current ($I_{SET}$) to flow through base resistors $R_B$, thereby using this current to maximum efficiency. Another advantage is that it eliminates the potential problems caused by the input resistor network R3–R6 in the feedback bootstrapping scheme, which may cause a portion of the output signal to kick back at the HF signal port and thereby complicate the system response.

A further advantage of the feedforward bootstrapping scheme illustrated in FIGS. 10 and 11 is that it eliminates potential problems that could be caused by the use of oversized coupling capacitors at the inputs to the HF squaring cell. If large coupling capacitors, (connected to a ground-referenced source) are used with the circuit of FIG. 6, the time-constants formed with the resistors in the biasing network could cause a temporary failure of the bootstrapping operation. When that happens, the current in Q1 and Q3 caused by a large signal at the input pulls down on their collector voltage before the feedback can assert an effect on their base voltages. Thus, these transistors go into saturation until the charging of the input capacitors catches up. Such problems are eliminated by the circuit of FIGS. 10 and 11. However, the feedforward bootstrapping scheme is a serviceable alternative in some application.

Structure of Base Current Compensation Circuit

Also shown in FIG. 11 is a base current compensation circuit 50 including PNP transistors Q24–Q26, NPN transistors Q27–Q29, resistor R18 and capacitor C8. Current source transistor Q29 has its emitter connected to GND through R18 and its base connected to $V_{REF}$ which provides the bias voltage necessary for generating a PTAT (proportional to absolute temperature) current in Q29. The collector of Q29 is connected to the emitter of similarly sized replication transistor Q27. The collector of Q27 is connected to $V_{POS}$, and its base is connected only to the collector of Q25. The emitters of Q24–Q26 are commonly connected to $V_{POS}$, and their bases are all connected together and to the collector of cascode transistor Q28. Transistor Q28 has its base connected to a voltage source $V_{INP}$ which is derived from the bias voltage at the input to the HF squaring cell, and its emitter connected to the collector of Q29. The collector of Q26 is connected to the base of Q4 at node 38 which forms one of the input terminals of the DC squaring cell. The collector of Q24 is connected to an input biasing network for the HF squaring cell as described below.

The current $I_{SET}$, which is a feedback signal when the circuit is configured for measurement and a set-point signal when the circuit is configured as a controller, comes from a set-point interface circuit such as that shown in FIG. 6. The current $I_{SET}$ is applied directly to the base of Q4.

Operation of Base Current Compensation Circuit

The function of the base current compensation circuit 50 is to generate a compensation current in the collector of Q26 that provides all of the quiescent base current in Q4 and half of that in Q5. This provision is important for preserving low-end accuracy; without compensation, there would be a fixed voltage error at the input of the DC squaring cell due to base currents which would translate to a measurement error at the output.

Transistor Q29 generates a PTAT current, most of which flows in the emitter of Q27. The base current to Q27 can only be provided from the collector of Q25, and since Q24 and Q26 share the same $V_{BE}$ with Q25, the base current in Q27 is replicated in the collectors of Q24 and Q26 (and may be scaled depending on the emitter area ratios).

Cascode transistor Q28, which has its base connected to a voltage $V_{INP}$ derived from the bias voltage at the input to the HF squaring cell, servos the circuit by providing the base current of Q24 while also ensuring that the emitter of Q27 operates at the same voltage as the emitter nodes E1 and E2. Maintaining the emitter of Q27 at the same potential as nodes E1 and E2 maintains the collectors of Q24–Q26 at the same potential. This is important to compensate for low Early voltages as well as variations in supply voltage. Thus, the compensation current generated by Q26 closely tracks the base current needed in Q4 and half the base current needed in Q5, even when the early voltage of the PNP transistors is very low. That is, the collector current through Q26 is a very precise replica of the zero-signal base current needed to the input 38 of the DC squaring cell, replicated through the base of Q27.

The PTAT current applied to the emitter of Q27 should be equal to half of the bias current $I_T$ through the DC squaring cell divided by the emitter area ratio of Q26 to Q25. For example, if the quiescent bias current through the squaring cell is 1 mA, and the emitter area of Q26 is five times greater than that of Q25, the quiescent current through Q27 should be set to about 97 $\mu$A.

Capacitor C8 stabilizes the high frequency gain through loop Q25, Q27, and Q28.

The current generated in the collector of Q24 provides base current compensation for the HF squaring cell, though with a different objective, namely to minimize in input bias voltage between the "power-down" and "power-up" conditions.

Structure and Operation of Input Biasing Circuit

Figure 12:
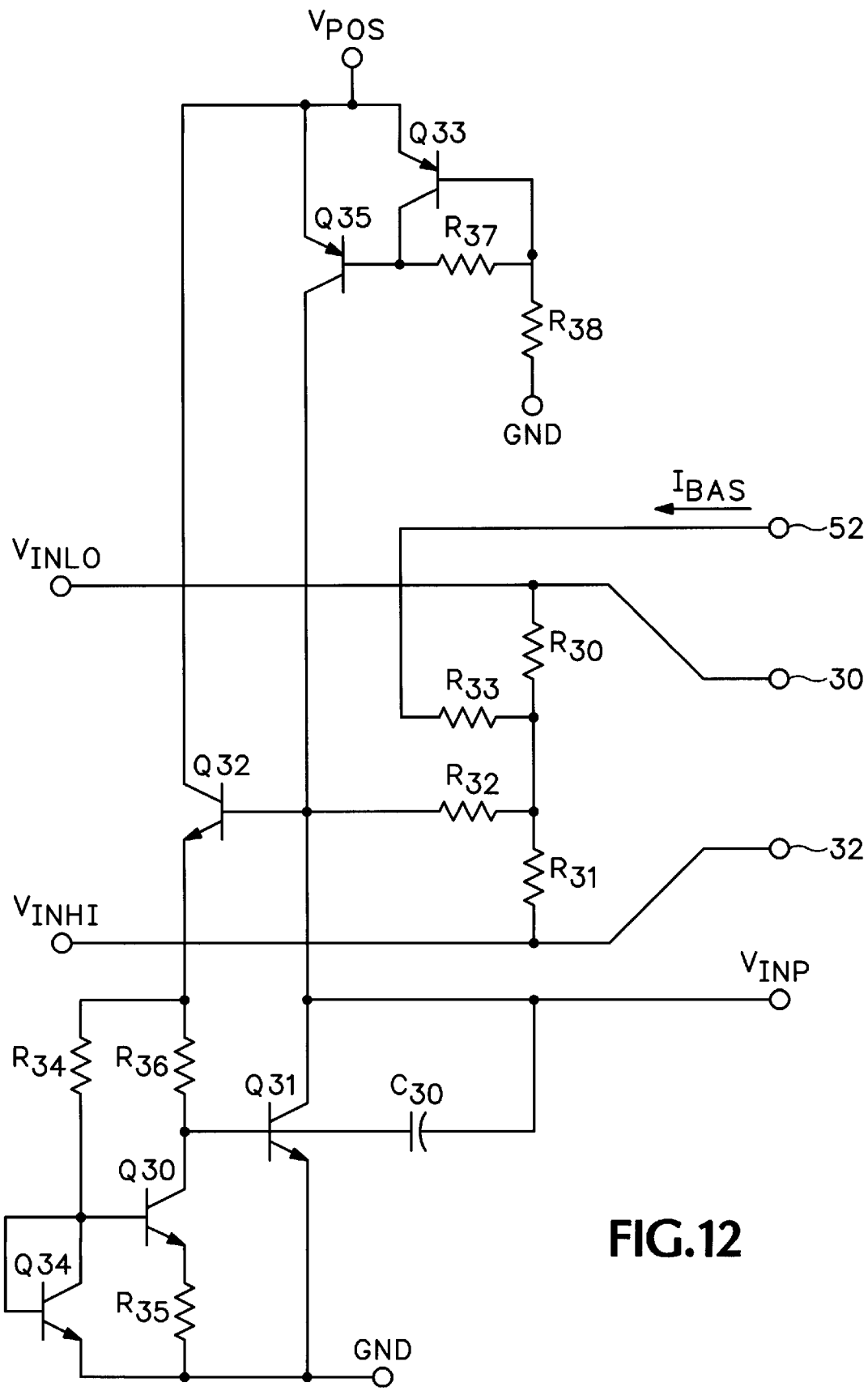
FIG. 12 is a simplified schematic diagram showing an input biasing scheme for a preferred embodiment of an RMS-to-DC converter in accordance with the present invention.

FIG. 12 is a simplified schematic diagram showing an input biasing scheme for a preferred embodiment of an RMS-to-DC converter in accordance with the present invention. The input bias is set to about 2 V above ground at 27° C. by an auxiliary band-gap reference comprising transistors Q30, Q31 and Q34 and resistors R34, R35 and R36 which generates about 1.2 V at the emitter of Q32 raised to 2 V by its $V_{BE}$. The primary bias for Q31 is provided by the gm-compensated current mirror Q33, Q35 and R37 supplied by a current set by R38, which flows during both power-down and power-up conditions.

The bias is supplied to the signal termination resistors R30, R31 through R32, which decouples the capacitance of the biasing circuit (mostly the collector capacitances of Q31 and Q35) from the input at high frequencies. The base compensation current $I_{BAS}$ for the HF squaring cell is provided through R33 from the collector of Q24 in the base current compensation circuit 50 of FIG. 11. Thus, the current in R32 is very low ensuring that there is little change in the bias voltage between power-down and power-up. The reference voltage $V_{INP}$ is obtained at the base of Q32 and provided to the cascode transistor Q28 in the base current compensation circuit 50 of FIG. 10. In the preferred embodiment, resistors R30 and R31 have a value of 50 ohms, base resistors $R_B$ are each 100 ohms, and resistor $R_A$ is 200 ohms, and therefore, the resistance seen looking into the input terminals $V_{INLO}$ and $V_{INHI}$ is 50 ohms. Resistors R32 and R33 are typically 10 Kohms.

Structure and Operation of Error Amplifier

Figure 13:
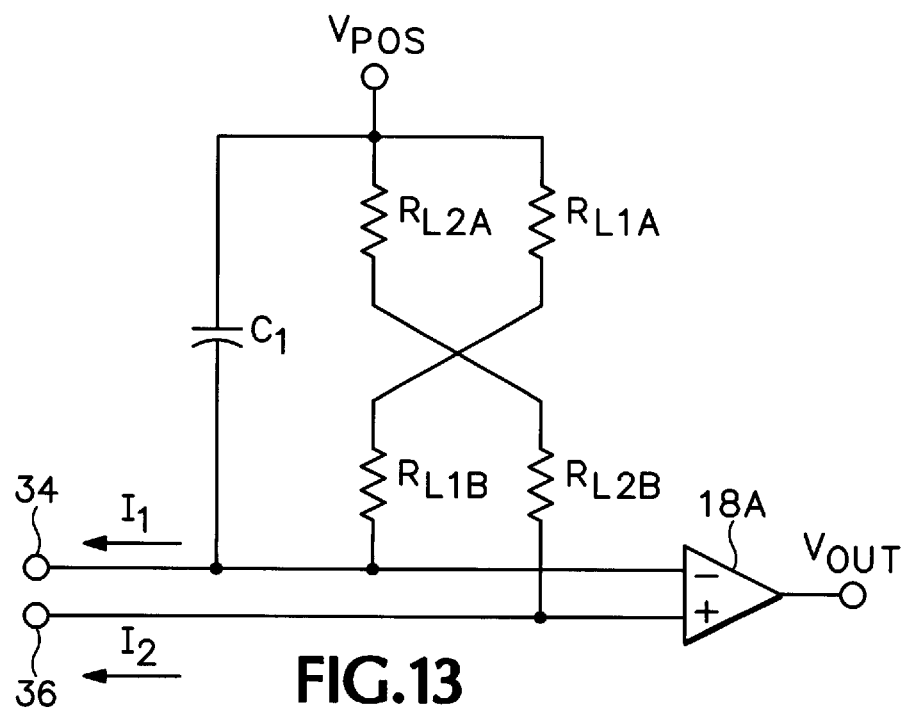
FIG. 13 is a simplified schematic diagram showing an error amplifier for a preferred embodiment of an RMS-to-DC converter in accordance with the present invention.

FIG. 13 is a simplified schematic diagram showing an error amplifier for a preferred embodiment of an RMS-to-DC converter in accordance with the present invention.

The error amplifier of FIG. 13 includes a high gain operational amplifier 18A which has its noninverting terminal connected to the output terminal 34 of the HF squaring cell 13 and its inverting terminal connected to the output terminal 36 of the DC squaring cell 15. A first load resistor $R_{L1}$ is connected between terminal 34 and $V_{POS}$, and a second load resistor $R_{L2}$ is connected between terminal 36 and $V_{POS}$. An on-chip filter capacitor C1, typically 60 pF, is connected between terminal 34 and $V_{POS}$, and provisions are made for connection of an external capacitor in parallel with C1. The two load resistors $R_{L1}$ and $R_{L2}$ are fabricated to be very well matched by using fully cross-quadded resistors $R_{L A 1}, R_{L 1 B}$ and $R_{L 2 A}, R_{L 2 B}$. Such matching is essential to the balance of the error amplifier.

The output voltage $V_{OUT}$ is obtained at the output of the amplifier 18A which is essentially an operational amplifier that is designed to provided a very high level of balance by using techniques such as cross-quadding the transistors for the input and load stages, aligning the central axis of the transistors across the chip in both directions to minimize mechanical stress, using closely matched collector voltages, etc. The amplifier 18A is configured so that its output increases in the positive direction, from a true-zero minimum value, in response to an increasing differential voltage of either polarity at the input to the HF squaring cell.

The error amplifier shown in FIG. 13 performs the differencing and integration functions somewhat indirectly. The currents $I_1$ and $I_2$ from the squaring cells are converted to a differential voltage signal at the input terminals of the op amp by load resistors $R_{L1}$ and $R_{L2}$. Capacitor C1 shunts load resistor $R_{L1}$, thereby implementing a simple time constant. Only the current from the HF squaring cell has to be low-pass filtered because the current from the DC squaring cell is already a quasi-DC signal.

The error amplifier must be very well balanced to handle the demanding requirements of this application which are brought about by the doubling of the dynamic range (in decibels) caused by the squaring process. In a preferred embodiment, op amp 18A is modeled after a precision instrumentation amplifier which uses well-known techniques for reducing the effects of offset voltages and currents.

An RMS-to-DC converter constructed in accordance with the present invention is well-suited to demanding applications such as CDMA (code division multiple access) which involve complicated transmission algorithms which in turn produce very complicated modulation envelopes on a carrier signal. The carrier signal might be a sinusoid operating a several GHz, but the modulation envelope, when viewed on an oscilloscope looks very much like noise. Extraction of the true RMS value of a CDMA signal requires a filtering time constant that is quite long compared to the carrier period.

Furthermore, a CDMA waveform also has a very high crest factor. The signal does not often deviate far from the baseline, but when it does, its peaks is high. Therefore, a true power detector for such signals must be able to provide both a filter with a long time constant and accurate response to the power contained in the high frequency waveform peaks. Conventional power measurement devices, such as logarithmic amplifiers, detector diodes, etc., do not measure the true RMS power. However, a true power detector in accordance with the present invention allows for the use of a large filter capacitor C1 to filter the noise like waveform of the modulation envelope, but the HF squaring cell is still fast enough to respond to all of the complexity of the complete signal represented by the high frequency carrier.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. An RMS-to-DC converter comprising:
   a first squaring cell for generating a first current responsive to a first input signal;
   a second squaring cell for generating a second current responsive to a second input signal; and
   a nulling circuit coupled to the first and second squaring cells for generating an output signal responsive to the first and second currents;
   wherein the nulling circuit is coupled to the second squaring cell in a feedback configuration to provide the output signal thereto as the second input signal.

2. An RMS-to-DC converter comprising:
   a first squaring cell for generating a first current responsive to a first input signal;
   a second squaring cell for generating a second current responsive to a second input signal; and
   a nulling circuit coupled to the first and second squaring cells for generating an output signal responsive to the first and second currents;
   wherein:
   the first squaring cell has a first output terminal and a second output terminal for providing the first current as a first differential current;
   the second squaring cell has a first output terminal and a second output terminal for providing the second current as a second differential current; and
   the output terminals of the first and second squaring cells are coupled together so as to generate a third differential current responsive to the difference of the first and second differential currents.

3. An RMS-to-DC converter according to claim 2 wherein the nulling circuit includes:
   a filter circuit coupled to the first and second squaring cells;
   a load circuit coupled to the first and second squaring cells; and
   an amplifier coupled to the load circuit to generate the output signal responsive to the third differential current.

4. An RMS-to-DC converter according to claim 3 wherein:
   the first output terminal of the first squaring cell is coupled to the second output terminal of the second squaring cell at a first node; and
   the second output terminal of the first squaring cell is coupled to the first output terminal of the second squaring cell at a second node.

5. An RMS-to-DC converter according to claim 3 wherein the filter circuit includes a capacitor coupled between the first and second nodes.

6. An RMS-to-DC converter according to claim 3 wherein the filter circuit includes:
   a first capacitor coupled between the first node and a common terminal; and a second capacitor coupled between the second node and the common terminal.

7. An RMS-to-DC converter according to claim 3 wherein the load circuit includes:
   a first resistor coupled between the first node and a common terminal; and
   a second resistor coupled between the second node and the common terminal.

8. An RMS-to-DC converter according to claim 2 wherein:
   the second output terminal of the first squaring cell is coupled to a common terminal; and
   the second output terminal of the second squaring cell is coupled to the common terminal.

9. An RMS-to-DC converter according to claim 8 wherein the nulling circuit includes:
   a filter circuit coupled to the first and second squaring cells;
   a load circuit coupled to the first and second squaring cells; and
   an amplifier coupled to the load circuit to generate the output signal responsive to the third differential current.

10. An RMS-to-DC converter according to claim 8 wherein the nulling circuit includes:
    an amplifier having a first input terminal coupled to the first output terminal of the first squaring cell and a second input terminal coupled to the first output terminal of the second squaring cell;
    a capacitor coupled to the first output terminal of the first squaring cell;
    a first resistor coupled between the first output terminal of the first squaring cell and a common terminal; and
    a second resistor coupled between the first output terminal of the second squaring cell and the common terminal.

11. An RMS-to-DC converter comprising:
    a first squaring cell for generating a first current responsive to a first input signal;
    a second squaring cell for generating a second current responsive to a second input signal; and
    a nulling circuit coupled to the first and second squaring cells for generating an output signal responsive to the first and second currents;
    wherein the first and second squaring cells are coupled together to balance the cells.

12. An RMS-to-DC converter according to claim 11 further including:
    a first bias current source coupled to the first squaring cell; and
    a second bias current source coupled to the second squaring cell.

13. An RMS-to-DC converter according to claim 12 wherein the first and second bias current sources are cross-quadded.

14. An RMS-to-DC converter according to claim 12 further including:
    a first cascode transistor coupled between the first squaring cell and the first bias current source; and
    a second cascode transistor coupled between the second squaring cell and the second bias current source.

15. An RMS-to-DC converter according to claim 12 wherein:
    the first squaring cell includes a first input port for receiving the first input signal and a first node for receiving a first bias current; and
    the second squaring cell includes a second input port for receiving the second input signal and a second node for receiving a second bias current.

16. An RMS-to-DC converter according to claim 15 further including a resistor network coupled between the first input port and the second input port for maintaining the first and second input ports at a common voltage.

17. An RMS-to-DC converter according to claim 15 further including a balancing amplifier having a first input terminal coupled to the first node, a second input terminal coupled to the second node, and an output terminal coupled to the input port of the second squaring cell, whereby the balancing amplifier maintains the first and second nodes at a common voltage.

18. An RMS-to-DC converter according to claim 17 further including a bias circuit coupled to the input port of the first squaring cell for maintaining the quiescent input voltage of the first squaring cell.

19. An RMS-to-DC converter according to claim 11 wherein the first and second squaring cells are cross-quadded.

20. An RMS-to-DC converter comprising:
    a first squaring cell for generating a first current responsive to a first input signal;
    a second squaring cell for generating a second current responsive to a second input signal; and
    a nulling circuit coupled to the first and second squaring cells for generating an output signal responsive to the first and second currents;
    wherein the first and second squaring cells each include a three-transistor, series-connected, multi-tanh cell.

21. An RMS-to-DC converter according to claim 20 wherein each of the multi-tanh cells includes:
    a first outer transistor having an emitter coupled to a common emitter node, a base forming a first input terminal of the squaring cell, and a collector;
    a second outer transistor having an emitter coupled to the common emitter node, a base forming a second input terminal of the squaring cell, and a collector coupled to the collector of the first outer transistor to form a first output terminal of the squaring cell;
    an inner transistor having an emitter coupled to the common emitter node, a base, and a collector forming a second output terminal of the squaring cell;
    a first base resistor coupled between the base of the first outer transistor and the base of the inner transistor; and
    a second base resistor coupled between the base of the second outer transistor and the base of the inner transistor.

22. An RMS-to-DC converter according to claim 21 wherein the first current is generated at the first output terminal of the first squaring cell.

23. An RMS-to-DC converter according to claim 21 wherein the first current is generated at the second output terminal of the first squaring cell.

24. An RMS-to-DC converter according to claim 21 wherein the emitter area of the inner transistors are about 26 times the emitter areas of the outer transistors.

25. An RMS-to-DC converter according to claim 21 wherein the emitter areas of the inner transistors are greater than 10 times the emitter areas of the outer transistors.

26. An RMS-to-DC converter according to claim 20 further including a base current compensation circuit coupled to the second squaring cell.

27. An RMS-to-DC converter according to claim 26 wherein the base current compensation circuit includes:
    a replication transistor having a base, an emitter and a collector;

a bias current source coupled to the replication transistor;

a current mirror coupled between the base of the replication transistor and the multi-tanh cell of the first squaring cell to provide a compensation current to the multi-tanh cell responsive to the base current of the replication transistor.

28. An RMS-to-DC converter comprising:

a first squaring cell for generating a first current responsive to a first input signal;

a second squaring cell for generating a second current responsive to a second input signal; and a nulling circuit coupled to the first and second squaring cells for generating an output signal responsive to the first and second currents;

further including a set-point interface circuit coupled to the second squaring cell for providing a set-point current thereto as the second input signal responsive to a set-point signal or a feedback signal.

29. An RMS-to-DC converter according to claim 21 further including:

a first bias current source coupled to the common emitter node of the first squaring cell; and a second bias current source coupled to the common emitter node of the second squaring cell; and wherein the nulling circuit includes:

a capacitor coupled to either the first or second output terminal of the first squaring cell to filter the first current;

a first load resistor coupled to the capacitor to convert the first current to a first voltage;

a second load resistor coupled to either the first or second output terminal of the second squaring cell to convert the second current to a second voltage; and an operational amplifier having a first input terminal coupled to the first resistor and a second input terminal coupled to the second resistor for generating the output signal responsive to the difference between the first voltage and the second voltage.

30. An RMS-to-DC converter according to claim 29 further including a set-point interface circuit coupled to the first input terminal of the second squaring cell for providing a set-point current thereto as the second input signal responsive to a set-point signal or a feedback signal.

31. An RMS-to-DC converter according to claim 30 further including a balancing amplifier having a first input terminal coupled to the first common emitter node, a second input terminal coupled to the second common emitter node, and an output terminal coupled to the second input terminal of the second squaring cell, whereby the balancing amplifier maintains the first and second common emitter nodes at the same voltage.

32. A method for performing an RMS-to-DC conversion comprising:

squaring a first input signal with a first squaring cell, thereby generating a first current;

squaring a second input signal with a second squaring cell, thereby generating a second current; and integrating the difference of the first and second currents, thereby generating an output signal;

further including using the output signal as the second input signal to the second squaring cell, thereby nulling the first and second currents.

33. A method for performing an RMS-to-DC conversion comprising:

squaring a first input signal with a first squaring cell, thereby generating a first current;

squaring a second input signal with a second squaring cell, thereby generating a second current;

integrating the difference of the first and second currents, thereby generating an output signal; and balancing the first and second squaring cells.

34. A method for performing an RMS-to-DC conversion comprising:

squaring a first input signal with a first squaring cell, thereby generating a first current;

squaring a second input signal with a second squaring cell, thereby generating a second current; and integrating the difference of the first and second currents, thereby generating an output signal;

wherein the first and second squaring cells each include a three-transistor, series-connected, multi-tanh cell having an input port and a common emitter node.

35. A method according to claim 34 further including balancing the first and second squaring cells.

36. A method according to claim 35 wherein balancing the first and second squaring cells includes maintaining the common emitter nodes of the first and second multi-tanh cells at the same voltage.

37. A method according to claim 36 wherein maintaining the common emitter nodes of the first and second multi-tanh cells at the same voltage includes driving the input port of the second multi-tanh cell responsive to the voltages at the first and second common emitter nodes.

38. A method according to claim 35 wherein balancing the first and second squaring cells includes maintaining the input ports of the first and second multi-tanh cells at the same quiescent voltage.

39. An RMS-to-DC converter comprising:

a first squaring cell for generating a first squared signal responsive to a first input signal;

a second squaring cell for generating a second squared signal responsive to a second input signal; and a nulling circuit coupled to the first and second squaring cells for generating an output signal responsive to the first and second squared signals;

wherein the first and second squaring cells are coupled together to balance the cells.

40. A method for performing an RMS-to-DC conversion comprising:

squaring a first input signal with a first squaring cell, thereby generating a first squared signal;

squaring a second input signal with a second squaring cell, thereby generating a second squared signal;

integrating the difference of the first and second squared signals, thereby generating an output signal; and balancing the first and second squaring cells.

41. A method for providing base current compensation to a transistor cell having an input terminal for receiving base current and a common connection node for receiving a bias current, the method comprising:

replicating the base current of the transistor cell in a replication transistor;

generating a compensation current responsive to the base current in the replication transistor; and applying the compensation current to the input terminal of the transistor cell.

42. A method according to claim 41 wherein replicating the base current includes:

biasing the replication transistor with a second bias current; and maintaining the emitter of the replication transistor at the same voltage as the common connection node of the transistor cell.

43. A method according to claim 42 wherein the second bias current is proportional to the bias current of the transistor cell.

44. A method according to claim 42 wherein the second bias current is proportional to absolute temperature.

45. A method according to claim 42 wherein maintaining the emitter of the replication transistor at the same voltage as the common connection node of the transistor cell includes servoing the replication transistor responsive to the voltage at the input terminal of the transistor cell.

46. A circuit for providing base current compensation to a transistor cell having an input terminal for receiving base current and a common connection node for receiving a bias current, the circuit comprising:

a replication transistor having a base, an emitter and a collector;

a bias current source coupled to the replication transistor to provide a second bias current thereto; and a current mirror coupled between the base of the replication transistor and the input terminal of the transistor cell to provide a compensation current to the input terminal of the transistor cell responsive to the base current of the replication transistor.

47. A circuit according to claim 46 further including a servo transistor coupled to the current mirror for servoing the circuit responsive to a voltage representative of the quiescent voltage at the input terminal of the transistor cell, thereby maintaining the emitter of the replication transistor at the same voltage as the common connection node of the transistor cell.

48. A circuit according to claim 46 wherein the second bias current is proportional to the bias current of the transistor cell.

49. A circuit according to claim 47 wherein:

the emitter of the replication transistor is coupled to a first power supply terminal through the current source;

the collector of the replication transistor is coupled a second power supply terminal;

the current mirror includes:

a first transistor having an emitter coupled to the second power supply terminal, a collector coupled to the base of the replication transistor, and a base, and a second transistor having an emitter coupled to the second power supply terminal, a collector coupled to the input terminal of the transistor cell, and a base coupled to the base of the first transistor; and the servo transistor has an emitter coupled to the emitter of the replication transistor, a base coupled to receive a voltage representative of the quiescent voltage at the input terminal of the transistor cell, and a collector coupled to the base of the first transistor of the current mirror.

\* \* \* \* \*

UNITED STATES PATENT AND TRADEMARK OFFICE
CERTIFICATE OF CORRECTION

PATENT NO. : 6,204,719 B1
DATED : March 20, 2001
INVENTOR(S) : Gilbert

It is certified that error appears in the above-identified patent and that said Letters Patent is hereby corrected as shown below:

Column 3,
Line 52, "(gin)" should read -- (gm) --.

Column 4,
Line 19, "squiring cell" should read -- squaring cell --.

Column 7,
Line 27, "about x+±3" should read -- about x=± 3 --.

Column 13,
Line 18, "RLA1" should read -- RL1A --.

Signed and Sealed this

Eighth Day of April, 2003

JAMES E. ROGAN
*Director of the United States Patent and Trademark Office*